(12) United States Patent
Gilton

(10) Patent No.: US 7,056,447 B2
(45) Date of Patent: Jun. 6, 2006

(54) SEMICONDUCTOR PROCESSING METHODS

(75) Inventor: Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 163 days.

(21) Appl. No.: 10/672,816

(22) Filed: Sep. 26, 2003

(65) Prior Publication Data
US 2005/0189321 A1  Sep. 1, 2005

Related U.S. Application Data

(63) Continuation of application No. 09/798,806, filed on Mar. 2, 2001, now Pat. No. 6,861,007.

(51) Int. Cl.
C03C 15/00  (2006.01)

(52) U.S. Cl. .................. 216/90; 216/91; 216/93; 216/96

(58) Field of Classification Search ............ 216/90, 216/91, 93, 96
See application file for complete search history.

(56) References Cited

U.S. PATENT DOCUMENTS

| | | |
|---|---|---|
| 5,431,861 A | 7/1995 | Nagahiro et al. |
| 5,464,480 A | 11/1995 | Matthews |
| 5,776,296 A | 7/1998 | Matthews |
| 5,783,790 A | 7/1998 | Mitsumori et al. |
| 5,803,956 A | 9/1998 | Ohmi et al. |
| 5,837,662 A * | 11/1998 | Chai et al. ............... 510/175 |
| 5,896,875 A * | 4/1999 | Yoneda ............... 134/102.3 |
| 5,944,907 A | 8/1999 | Ohmi |
| 6,197,733 B1 | 3/2001 | Mikami et al. |
| 6,240,933 B1 | 6/2001 | Bergman ............... 134/1.3 |
| 6,267,125 B1 | 7/2001 | Bergman et al. ......... 134/102.1 |
| 6,273,108 B1 | 8/2001 | Bergman et al. |
| 6,451,660 B1 * | 9/2002 | Ma et al. ............... 438/343 |
| 6,552,380 B1 * | 4/2003 | Sato et al. ............... 257/301 |
| 6,617,226 B1 * | 9/2003 | Suguro et al. ............ 438/481 |
| 6,645,874 B1 | 11/2003 | Torek et al. ............ 438/723 |
| 6,730,581 B1 * | 5/2004 | Suguro .................. 438/486 |
| 6,797,194 B1 * | 9/2004 | Kikuyama et al. ......... 252/79.1 |
| 2001/0037816 A1 | 11/2001 | Torek et al. |

OTHER PUBLICATIONS

U.S. Appl. No. 09/386,247, filed Aug. 31, 1999, Torek et al.

* cited by examiner

Primary Examiner—Nadine G. Norton
Assistant Examiner—Binh X. Tran
(74) Attorney, Agent, or Firm—Wells St. John P.S.

(57) ABSTRACT

Embodiments in accordance with the present invention provide for removing organic materials from substrates, for example substrates employed in the fabrication of integrated circuits, liquid crystal displays and the like. Such embodiments also provide for forming self-limiting oxide layers on oxidizable materials disposed on such substrates where such materials are exposed to the methods of the present invention. The methods of the present invention provide for contacting substrates with a solution of ozone, water and a surfactant, the solution being effective for removing organic materials and forming self-limiting oxide layers on oxidizable materials.

30 Claims, 3 Drawing Sheets

SEMICONDUCTOR PROCESSING METHODS

RELATED PATENT DATA This patent resulted from a continuation application of U.S. patent application Ser. No. 09/798,806, filed Mar. 2, 2001, now U.S. Pat. No. 6,861,007 entitled "Method for Removing Organic Material From a Substrate and for Oxidizing Oxidizable Material Thereon", naming Terry L. Gilton as inventor, the disclosure of which is incorporated by reference.

TECHNICAL FIELD

The present invention relates generally to methods of removing organic materials from a substrate and in some embodiments oxidizing oxidizable materials thereon. More specifically, the present invention relates to methods that employ a solution of water, ozone and a surfactant for both removing organic materials from substrates and for forming self-limiting oxide layers from oxidizable material on the substrates.

BACKGROUND

The fabrication of integrated circuits typically uses a number of photolithographic steps to impart a pattern on a semiconductive substrate or wafer. For example, where a layer of material, such as polycrystalline silicon or aluminum, is formed over the wafer, a layer of an organic material such as a photoresist, is subsequently formed over the material. The photoresist is then selectively exposed to an energy source and then processed to provide a pattern that is representative of the selective exposure. Thus some portions of the material underlying the photoresist remain covered while other portions are exposed. Once such a pattern is formed in the photoresist, a subsequent process is employed to replicate that pattern in the underlying material. For example, polycrystalline silicon and aluminum can be patterned using a plasma etching process that removes the exposed portions of such material, thus replicating the pattern. Once this etching process is completed, generally the photoresist is removed prior to any subsequent processing step.

While there are a variety of well known methods for removing such photoresist material, as semiconductor technology has advanced to create higher performance integrated circuits, such previously known methods are often problematic. For example, one such previously known method is commonly known as Plasma Ashing and employs an electrically induced oxygen plasma to oxidize the organic material of the photoresist into gaseous products such as carbon dioxide and water vapor. However, advanced integrated circuits are often susceptible to damage by the action of the electrical fields required to create a plasma that is sufficient for such an oxidative process. Other well known methods employ strong oxidizing chemicals in baths or use such chemicals in spraying mechanisms to remove the organic photoresist material. One such strong oxidizing material is a mixture of concentrated sulfuric acid and hydrogen peroxide, often referred to as "Pirhana." However, while such strong chemicals are effective, they are also hazardous to the people that use them; they are difficult to dispose of after use without taking extensive measures to protect the environment; and they are not generally applicable to removing photoresist from materials such as those that encompass aluminum and other metals.

Therefore it would be advantageous to provide methods for removing organic materials, for example photoresist, from semiconductive wafers with methods that will reduce or eliminate damage to circuit elements formed thereon. It would also be advantageous if such methods did not require the use of chemicals that are hazardous to both the people that use them and to the environment.

Finally, it has been found that it is often advantageous to form a self-limiting oxide layer, that is to say a layer of oxide having a thickness that is limited by the growth of the film itself, over any oxidizable materials that are exposed to oxidizing conditions during subsequent processing. Such oxide layers are often thought of as passivating the surface of the oxidizable material, where such passivation limits the reactivity of the exposed material during a subsequent process. While such previously known methods as plasma ashing and immersion into chemical baths containing "Piranha" can and do oxidize oxidizable materials to form such oxide passivation layers, it would be advantageous to provide alternative methods for forming such layers that do not use hazardous materials and/or potentially damage advanced semiconductor devices.

SUMMARY

Embodiments in accordance with the present invention provide or removing organic materials from substrates such as semiconductor wafers and the like. Such embodiments also can provide for forming self-limiting oxide layers on oxidizable materials disposed on such substrates where such materials are exposed to the methods of the present invention.

In some embodiments in accordance with the present invention, a substrate is contacted with a solution of ozone, water and a surfactant. In some such embodiments, exemplary surfactants are generally non-ionic. In some embodiments, the contacting is provided by an apparatus configured, for example, to spray the solution of ozone, water and surfactant onto a major surface of the substrate, although other methods for contacting are also appropriately employed. In some embodiments, the spraying apparatus is configured to spray the substrate with the solution for a first time period and subsequently stop spraying for a second time period and then subsequently repeat the spraying and not spraying for a number of such spraying and not spraying cycles, such number of cycles providing a third time period of spraying, a fourth time period of not spraying and so on. Such embodiments of the present invention are effective for the removal of organic material from the substrate, the oxidation of exposed oxidizable materials of or on the substrate or both of the removal and the oxidation.

In some embodiments of the present invention a solution of ozone, water and surfactant is heated to a first temperature and maintained at that temperature for the contacting. Some embodiments in accordance with the present invention provide the contacting within a chamber or enclosure encompassing an atmosphere that has a first concentration of ozone and where the enclosure is heated to and maintained at a second temperature. In such embodiments where both the solution and the enclosure are heated, generally the first temperature is higher than the second temperature and the first concentration of ozone is higher than the concentration of ozone in the solution. Such embodiments of the present invention are also effective for the removal of organic material from the substrate, the oxidation of exposed oxidizable materials of the substrate to form a self-limiting oxide or passivation layer, or both.

In some embodiments in accordance with the present invention, a solution of ozone, water and a surfactant are provided in a chamber where the pressure of a localized atmosphere in the chamber is greater than atmospheric pressure. Such embodiments provide for enhancing the concentration of ozone in the solution, for any given initial concentration and at any given temperature, over that of embodiments that do not employ a pressure greater than atmospheric pressure.

BRIEF DESCRIPTION OF THE DRAWINGS

Embodiments in accordance with the present invention are described below with reference to the following accompanying drawings.

DETAILED DESCRIPTION

This disclosure of the invention is submitted in furtherance of the constitutional purposes of the U.S. Patent Laws "to promote the progress of science and useful arts" (Article 1, Section 8).

Embodiments in accordance with the present invention are useful for removing organic material from a wide variety of substrates, such substrates encompassing oxidizable material or not. Therefore, it will be understood that while embodiments of the present invention will be described below with reference to semiconductor substrates and semiconductor processing, that such is for ease of understanding and description only. Thus the scope and spirit of embodiments of the present invention advantageously include other substrates and other processing, for example liquid crystal display substrates and processing, magnetic and/or optical storage medium substrates and processing and the like.

Figure 1:
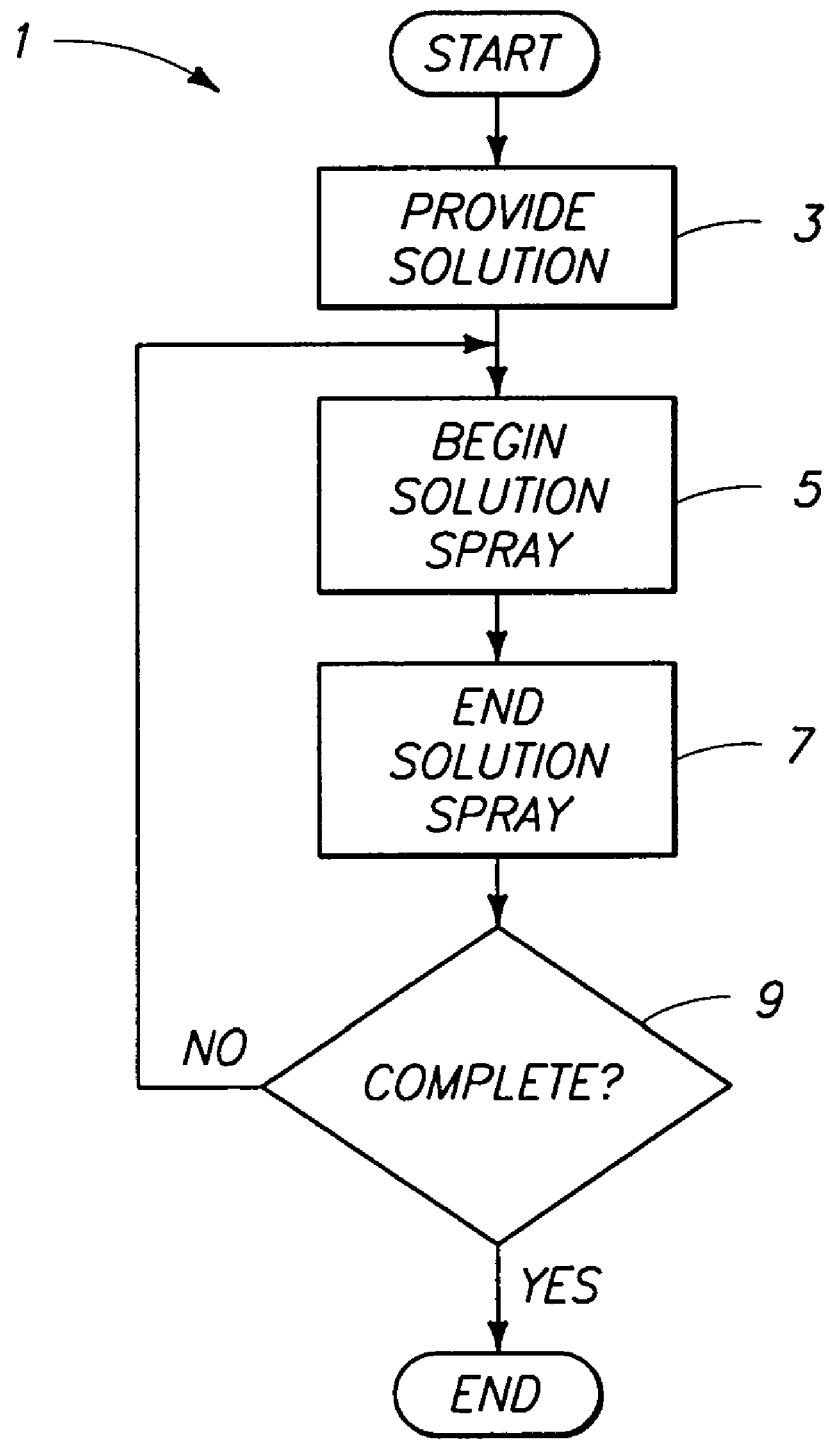
FIG. 1 is a flow diagram of an embodiment in accordance with an aspect of the present invention.

Referring to FIG. 1, a flow diagram of an embodiment in accordance with the present invention is depicted. A substrate spraying process 1 encompasses providing a solution 3 of ozone and water and a surfactant, where generally the water includes a concentration of the surfactant. Thus, in some embodiments, the surfactant is added to the water, typically deionized or otherwise purified water, prior to the introduction of ozone. Advantageously this addition can be performed at essentially any time prior to the adding ozone such that appropriate water/surfactant solutions can be prepared and stored in bulk form where desirable. For example, such aqueous solutions can be prepared hours, days, weeks or more before use in embodiments of the present invention without concern for any ozone degradation. However, in some embodiments in accordance with the present invention, the addition of the surfactant is performed contemporaneously with or prior to the addition of ozone to the water.

It has been found that a wide variety of surfactants and surfactant concentrations are useful. Where an organic material is to be removed, for example a photoresist, guidelines or criteria for determining such utility include, but are not limited to, (1) chemical stability in the presence of the concentrations of ozone that are employed, (2) that the surfactant "wets" the surface of the normally hydrophobic organic material that is to be removed and (3) that such properties do not appreciably change in the presence of any reaction products that may result from such a removal process. In particular it has been found that such removal processes can result in the incorporation of carbon dioxide, a reaction product, into the aqueous solution and thus result in a lowering of the pH of the solution. Thus, surfactants that are relatively insensitive to this lowering are advantageously employed. One such class of surfactants are non-ionic surfactants such as the family of surfactants commercially available from AirProducts and Chemicals, Inc., of Allentown, Pa. under the name Surfynol®. For example, Surfynol 440 has been found to be effective in embodiments of the present invention in concentration of between about 1 to 200 parts per million (ppm), and advantageously between about 1 to 20 ppm. Additionally, the Surfynol® family of ethoxylated sorbitan monooleates are found to further reduce of surface tension on organic materials such as photoresist, as pH is lowered due to the effect of carbon dioxide. It will be understood that reference herein to non-ionic surfactants is not limited to the family of Surfynol® surfactants or only to ethoxylated sorbitan monooleates in general, but that such reference includes other non-ionic surfactants, for example, functional equivalents of such ethoxylated sorbitan monooleates, or any of the other exemplary surfactant discussed herein, which are understood to mean materials that provide an equivalent function or result. Thus the functional equivalent of one of the exemplary surfactants described herein will provide a similar reduction in surface tension, or wettability, for a target surface.

It has also been found that some ionic surfactants can be advantageously employed for embodiments in accordance with the present invention. For example, Surfynol CT-141 is an anionic material generally employed as a dispersant for pigments. However, such material is also found effective for reducing surface tension and making a normally hydrophobic organic material more wettable. It has also been found that various quaternary ammonium chloride surfactants provide advantageous results in some embodiments of the present invention. Such quaternary ammonium chloride materials having the general formula $R_4NCl$, where R is an organic substituent. Thus, the specific composition of the surfactant selected is less a function of its chemical structure than its specific performance as evaluated, in part, using the previously mentioned guidelines. It necessarily follows then that any material that meets such suggested guidelines, regardless of its chemical composition, is within the scope and spirit of the present invention. Furthermore, it will be understood that the specific concentration of surfactant is a function of, in significant part, its ability to wet the surface of a specific hydrophobic material, and thus must be determined for each surfactant and material combination. However, concentrations in the range of about 1 ppm to 200 ppm, and more specifically 1 ppm to 20 ppm have been found effective.

It will of course be understood that providing the solution also encompasses incorporating ozone into a water/surfactant solution effective for its purpose. While ozone is not extremely soluble in water, it has advantageously been found that concentrations of ozone in the aqueous solution that are in the range of between about 1 to 100 ppm can be obtained. In some embodiments in accordance with the present invention, such concentrations are obtained by providing the water/surfactant solution into a chamber having an atmosphere with a concentration of ozone in excess of the concentration in the solution. For example, where the concentration of ozone in the solution is 10 ppm, an atmosphere with a concentration of just in excess of 10 ppm to as much as 5% or more, can be employed. In addition, some embodiments encompass providing the solution in a chamber pressurized to above normal atmospheric pressure with ozone to enhance the solubility of the ozone in the water/surfactant solution. For example, in some embodiments, the process chamber is pressurized with ozone to a total pressure of approximately twice atmospheric pressure. Other methods of incorporating ozone into the water/surfactant solution in concentrations of between 1 ppm to 100 ppm, such as reducing the temperature of the provided aqueous solution prior to introduction into a process chamber are also effective. However it is found that reduced temperatures in general reduce the rate of organic material removal, thus such solutions are either heated prior to use or a combination of an appropriately high concentration of ozone and temperature is selected to be effective for removing organic material the lower temperature employed to dissolve the ozone. Therefore, it will be understood, that in some embodiments of the present invention, the solution is initially provided with a first concentration of ozone which becomes a second concentration, for example by the action of the highly concentrated ozone atmosphere of the chamber or other appropriate cause.

As depicted in FIG. 1, spraying process 1 also encompasses a begin solution spray 5 and an end solution spray 7. Thus, an apparatus is provided that begins spraying 5 of the provided solution 3 onto a substrate for a first period of time, where generally such spraying is focused on a major surface of the substrate or wafer. At the end of the first period, the solution spray is ended 7 and no further spraying occurs for a second period of time. Whether or not the removal of organic material present on the substrate is complete 9, is decided and, if not, begin solution spray 5 and end solution spray 7 are typically repeated. After each repeat cycle of begin 5 and end 7, whether or not the removal of the material is complete 9, is again decided and generally, when a material removed status is obtained, spraying process 1 is ended. One such apparatus for providing spraying process 1 is described in commonly assigned, pending U.S. patent application Ser. No. 09/386,247, entitled "Delivery of Dissolved Ozone," filed on Aug. 30, 1999, and which is incorporated by reference herein.

The above-referenced application describes a cycled on and off spraying process that provides advantages over a continuous spraying process. Such advantages encompass (1) providing less overall solution to the substrate and the organic material thereon; and (2) providing a pulsing solution boundary layer that can serve to help loosen "chucks" of the organic material, thus hastening its removal and shortening overall processing time. It will be understood that such advantages can lead to reduced costs in both materials and in process time. As also described in the above referenced application at page 7, line 18 through page 15, line 9, such a pulsing or cycled on and off spraying process can be implemented with various time periods of spray-on and spray-off as well as various duty cycles for the on-time and off-time. In addition, the above-referenced application describes and illustrates embodiments of a process chamber that can be operated at atmospheric pressure or above, that includes spray nozzles, and that provides spray timing and decision making needed to provide the function of what is referred to as step S4.

Figure 2:
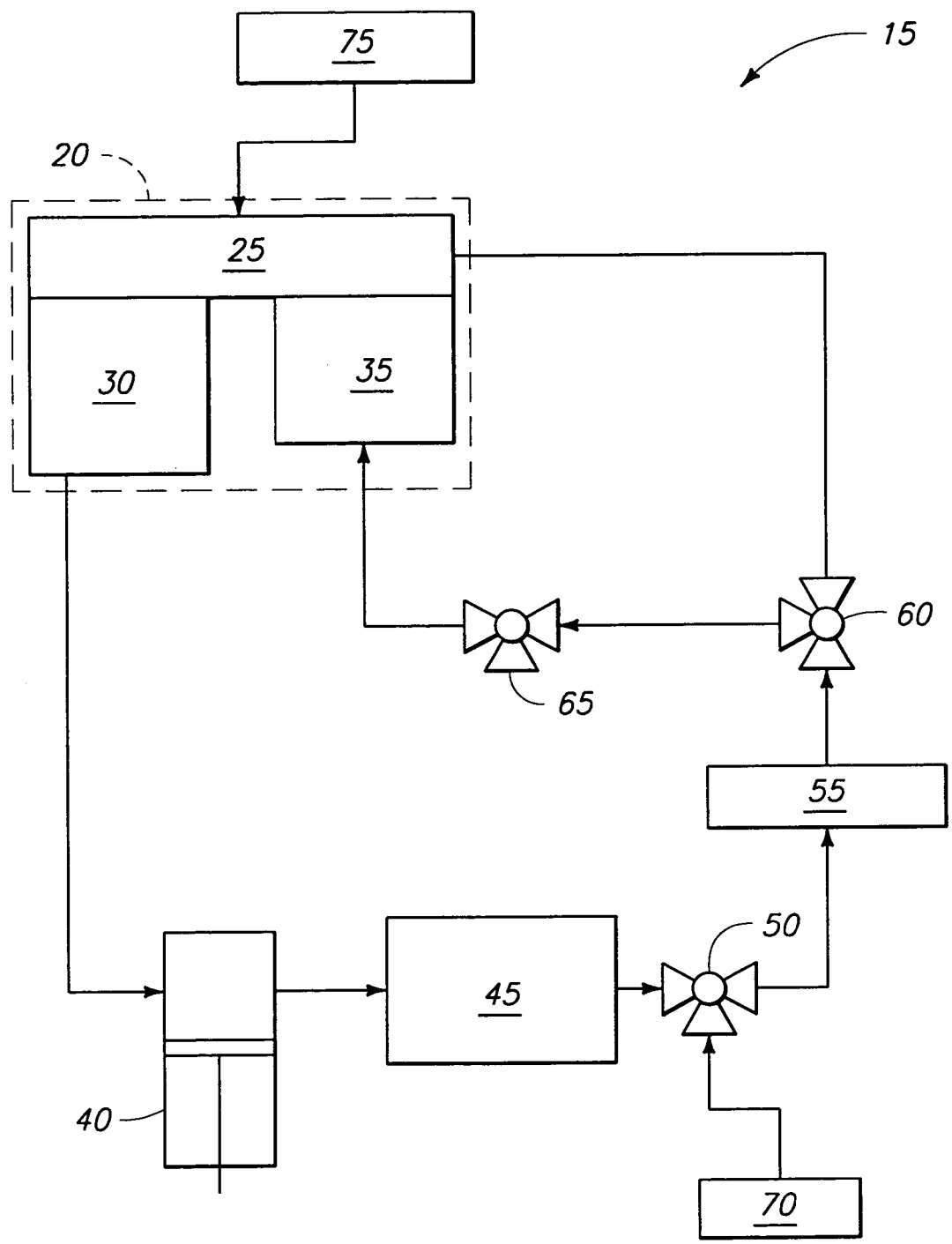
FIG. 2 is schematic diagram of an apparatus suitable for performing the embodiment of FIG. 1.

For example, FIG. 2, a slightly modified version of FIG. 2 from the referenced application, describes an embodiment of a shower system 15 having a process chamber 20 with a process chamber lid 25, a full chamber 30 and a short chamber 35. A pump 40 is employed to pump the provided solution 3 from full chamber 30 to a heater 45, where heater 45 can raise the temperature of the solution to a desired temperature. Once heated to that temperature, the provided solution 3 is filtered at filter apparatus 55 and supplied to a first valve 60. As depicted, first valve 60 allows for the filtered solution to pass either directly to chamber lid 25 and/or to short chamber 35. Where the provided solution 3 is directed to lid 25, such solution 3 is sprayed onto one or more substrates through spraying devices such as nozzles, for example see nozzles 75 in FIG. 3 of the referenced application. Where such solution 3 is directed to chamber 35, such chamber 35 is filled and overflows into full chamber 30 in a manner analogous to a cascade bath rinse.

Also seen in FIG. 2 are second valve 65 and third valve 50. Second valve 65 is positioned between first valve 60 and short chamber 35 to advantageously provide for draining such chamber. Third valve 50 is shown positioned between heater 45 and filter 55 and advantageously is used to supply the provided solution 3 to spray system 15, or for draining full chamber 30. It will be understood that the position of such valves is exemplary, and that other positions within system 15 can also be advantageous. For example, in some embodiments in accordance with the present invention, third valve 50 can be positioned between pump 40 and heater 45. Thus, as depicted in FIG. 2, spray system 15 provides for re-circulation of the provided solution 3 during any processing, as well as the addition of provided solution 3 to replenish any of such solution as can be lost during such processing.

As mentioned above, provided solution 3 can be free of any enhanced concentration of ozone and the actual completion of the providing 3 accomplished upon the introduction of such solution into spray system 15. Thus solution source 70 can, in some embodiments, serve to provide a first solution precursor encompassing only water with a concentration of surfactant. In other embodiments, solution source 70 can contain a second solution precursor encompassing water with a concentration of surfactant and another concentration of ozone. However, it will be understood that, as depicted, spray system 15 also encompasses an ozone source 75 for providing ozone to system 15 to provide an ozone enriched atmosphere within chamber 25. In this manner a final ozone concentration in the solution present in chambers 30 and 35 is no less than, and generally more than, the concentration of ozone in the solution supplied from source 70.

In some embodiments in accordance with the present invention, in addition to the provided solution being heated by heater 45, chamber 20 as a whole, or either or both of chambers 30 and 35 also heated. In some embodiments, chamber temperature is set equal to that of the solution, while in some embodiments it is set to a temperature either higher or lower than the solution temperature. Generally, it has been found that temperatures in the range of between about 20 C to about 95 C are effective for both the chamber and the solution, and generally the temperature of the bath and the solution are essentially equal, the bath generally being slightly higher. However other ranges of temperatures such as about 65 C to about 95 C and about 80 C to about 95 C are also generally known to be effective.

Such begin spraying 5 and end spraying 7 serve to provide fresh solution to the surface of the organic material on the substrate as well as to provide an interface or meniscus defined by the surface of the solution and the surface of the substrate or organic material thereon. It is believed that the presence of the surfactant provides for a wettable surface such that the meniscus formed is in essentially complete contact with the underlying organic material. Furthermore, this interface or meniscus may provide for enhanced removal of the organic material proximate the meniscus by providing a location where carbon dioxide, a product of the organic material removal reaction, can leave the solution while at the same time ozone from the ozone enriched atmosphere in chamber 25, can replenish the ozone in the solution as it is consumed by the removal reaction. In this manner, it has been found, that the removal rate of the organic material is greater than if the substrate were sprayed with solution that does not encompass the surfactant.

While the embodiments of the above-referenced application, as incorporated herein by reference, are effective for removing organic material from substrates, it has been advantageously found that the addition of the aforementioned surfactant provides for an enhanced effectiveness. For example, a solution with an ozone concentration of about 10 ppm and a Surfynol surfactant concentration of about 100 ppm successfully removed a layer of Olin Hunt 10i photoresist, approximately 1650 nanometers (nm) thick, in about two minutes at a temperature of 65 degrees Celsius (C) using an embodiment of the process of FIG. 1 and the apparatus of FIG. 2. Absent the addition of such a concentration of surfactant, the process and apparatus of the referenced application, required about five minutes to successfully removed a similar layer of Olin Hunt 10i. Thus, some embodiments in accordance with the present invention, are twice as effective, or more, for removing organic material as those of the referenced application.

The specific conditions provided in the above exemplary result are provided for illustrative purpose only and that other specific conditions can be advantageously employed. It will be understood that at temperatures lower than the 65 C employed above, a higher concentration of ozone than 10 ppm would most likely be needed to achieve an equivalent removal rate, and at higher temperatures than the 65 C, a lower concentration of ozone most likely can be used. Therefore these alternate temperatures and ozone concentrations are within the scope and spirit of the invention. Thus it will be understood that embodiments in accordance with the present invention can encompass a wide range of ozone concentrations such as where a specific concentration selected will be a function of the temperature employed, as well as the desired rate of organic material removal, among other things. Furthermore, such decisions as to specific temperatures, surfactant material and concentration, ozone concentration and the timing of the duty cycle of the spraying are choices that one of ordinary skill in the art can make from the teachings herein, without undue experimentation.

Figure 3:
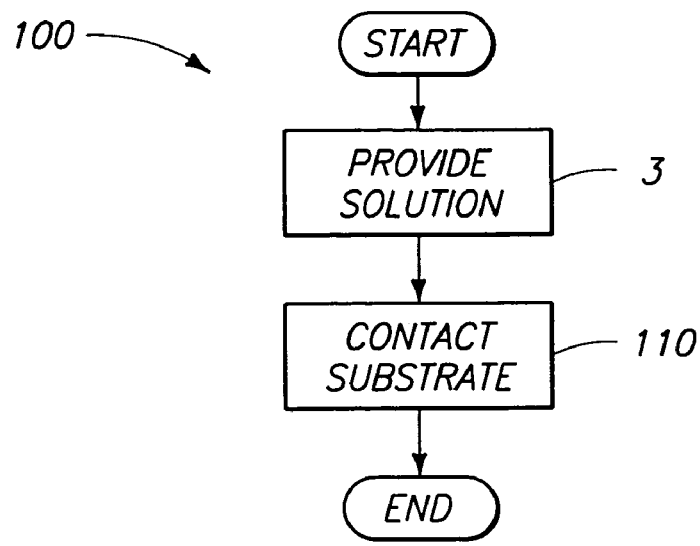
FIG. 3 is a flow diagram of another embodiment in accordance with an aspect of the present invention.

Referring now to FIG. 3, another embodiment in accordance with the present invention is depicted. Substrate contacting process 100 encompasses a solution providing 3 step essentially equivalent to that described above. However, rather than spraying the substrates with such a solution, process 100 immerses substrates in the solution. Such immersing embodiments of the present invention are advantageously possible due to more aggressive nature of solution provided 3 with such embodiments of the present invention. That is to say, the provided aqueous solution encompasses a concentration of surfactant as well as ozone. Thus, as depicted, contacting solution 110 encompasses immersing the substrate in a bath or tank containing the solution for a first time period and subsequently removing the substrate from the solution for a second time period. The immersing and removing is generally repeated a number of times for the same or varying time periods until the organic material is removed in a manner analogous to that described above for the spraying.

While embodiments of the present invention are generally provided to time either the spray or immersion processing for providing the cycle processing described above, such embodiments are also provided with an apparatus configured to "decide" when the processing is complete. While generally such a decision is a function of the total amount of spray or immersion time, other decision making functionality can be provided. For example, in some embodiments, an apparatus for optically detecting the removal of the organic material is provided such that the detecting apparatus can provide data for deciding whether or not the removal process is complete.

Figure 4:
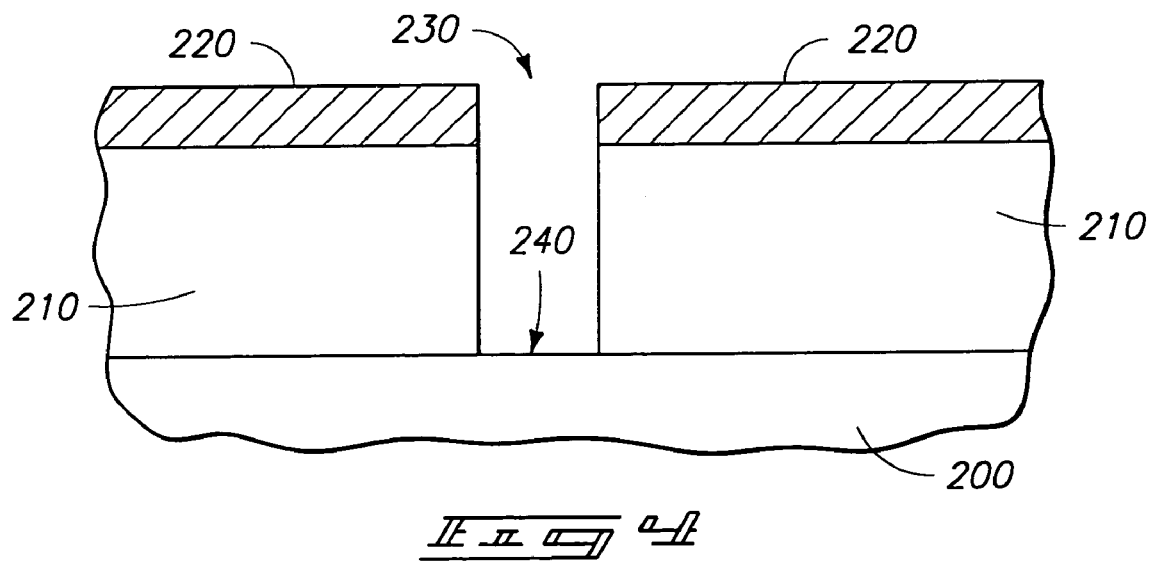
FIG. 4 is a cross-sectional view of a portion of a semiconductor device prior to forming a self-limiting oxide in accordance with embodiments of the present invention.

As mentioned above, embodiments in accordance with the present invention also encompass forming an oxide layer, generally a self-limiting oxide layer, over the substrate. Advantageously, the processing for removing organic material from substrates is generally effective for forming such an oxide layer. However, it will be noted that such formation is enhanced by the presence of the surfactant, as compared to processes without surfactant. For example, referring now to FIG. 4, a cross-sectional view of an exemplary portion of a semiconductor device is shown. Depicted is a substrate portion 200, for example a silicon substrate, overlaid by portions of a first layer 210, for example silicon oxide, and a second layer 220, for example polysilicon, such that an opening 230 is exposing a surface portion 240 of the substrate 200. Since both the exposed surface 240 and the polysilicon layer 220 are hydrophobic, and the silicon oxide is hydrophilic, and where opening 230 is small, surface 240 may not typically be wetted by an aqueous solution. Therefore, where it is desirable to form a an oxide layer over surface 240, the presence of a surfactant in the solutions of embodiments in accordance with the present invention, better provides for the wetting of a surface such as surface 240. Thus, where surface 240 is wetted, the ozone present in such a solution can provide for the formation of the oxide layer thereon.

Furthermore, it will be understood, that such self-limiting oxide formation is not limited only to forming oxide layers in combination with the removal of organic material such as photoresist, as is a general practice. Rather, embodiments of the present invention can be employed to form such oxide layers as an independent process whenever such layers are deemed desirable. Also, it will be understood that the formation of self-limiting oxide layers is not limited to the forming of silicon oxide layers. Rather, such self-limiting oxide formation includes the formation of any of the generally self-limiting metal oxides, such as aluminum oxide or the generally self-limiting oxide of any semiconductive material.

It will be understood that the methods of contacting the substrate described herein, spraying and immersing, are described for exemplary purposes and to enable a clear understanding of the instant invention only. Thus such exemplary descriptions do not exclude other methods of contacting the substrate, for example brushing the substrate with a device for bushing, which are also within the scope and spirit of the instant invention. Similarly, embodiments of the present invention are described where a solution of ozone and water is provided, the water portion further described as comprising a concentration of a surfactant. It will be understood that such descriptive language is not meant to imply any required order of mixing water, ozone and a surfactant, and that embodiments in accordance with the present invention encompass any order of mixing that is appropriate.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor processing method comprising:
providing a semiconductor substrate comprising a first hydrophobic material, a second hydrophilic material received outwardly of the first hydrophobic material, and a third hydrophobic material received outwardly of the second hydrophilic material;
forming an opening through the third and second materials to the first material; and
exposing the first, second and third materials to a solution comprising ozone, water and a surfactant effective to form an oxide layer on the first hydrophobic material within the opening.

2. The method of claim 1 wherein the exposing is effective to form the oxide layer to be self-limiting in thickness to be less than or equal to 1 nanometer thick.

3. The method of claim 1 wherein the surfactant comprises a non-ionic material.

4. The method of claim 1 wherein the surfactant comprises a quaternary ammonium chloride material.

5. The method of claim 1 wherein the surfactant comprises a non-ionic material selected from the group consisting of an ethoxylated sorbitan monooleate, and functional equivalents of ethoxylated sorbitan monooleate.

6. The method of claim 1 further comprising providing a gaseous atmosphere comprising a concentration of ozone within the process chamber.

7. The method of claim 1 further comprising providing a gaseous atmosphere comprising a concentration of ozone within the process chamber which is greater than concentration of ozone in the solution.

8. The method of claim 1 further comprising providing a gaseous atmosphere comprising a concentration of ozone within the process chamber, the gaseous atmosphere having a pressure in excess of atmospheric pressure.

9. The method of claim 1 wherein the water is deionized water.

10. The method of claim 1 wherein the first hydrophobic material comprises silicon.

11. The method of claim 1 wherein the second hydrophific material comprises silicon oxide.

12. The method of claim 1 wherein the third hydrophobic material comprises silicon.

13. The method of claim 12 wherein the third hydrophobic material comprises polysilicon.

14. The method of claim 1 wherein the exposing comprises spraying the substrate with the solution within a chamber, the spraying comprising maintaining the solution at a first temperature between approximately 20° C. and approximately 95° C., and the chamber at a second temperature between approximately 20° C. and approximately 95° C.

15. The method of claim 14 wherein the first temperature and second temperature are approximately equal.

16. The method of claim 14 wherein the first temperature is higher than the second temperature.

17. The method of claim 14 wherein the first temperature is maintained between approximately 65° C. and approximately 95° C.

18. A semiconductor processing method comprising:
providing a semiconductor substrate comprising a silicon-containing region, a silicon oxide-containing layer received outwardly of the silicon-containing region, and a polysilicon-containing layer received outwardly of the silicon oxide-containing layer;
forming an opening through the polysilicon-containing layer and the silicon oxide-containing layer to the silicon-containing region; and
exposing the polysilicon-containing layer, the silicon oxide-containing layer and the silicon-containing region to a solution comprising ozone, water and a surfactant effective to form a silicon oxide-comprising layer on the silicon-containing region within the opening.

19. The method of claim 18 wherein the exposing is effective to form the silicon oxide-containing layer to be self-limiting in thickness to be less than or equal to 1 nanometer thick.

20. The method of claim 18 wherein the surfactant comprises a non-ionic material.

21. The method of claim 18 wherein the surfactant comprises a quaternary ammonium chloride material.

22. The method of claim 18 wherein the surfactant comprises a non-ionic material selected from the group consisting of an ethoxylated sorbitan monooleate, and functional equivalents of ethoxylated sorbitan monooleate.

23. The method of claim 18 further comprising providing a gaseous atmosphere comprising a concentration of ozone within the process chamber.

24. The method of claim 18 further comprising providing a gaseous atmosphere comprising a concentration of ozone within the process chamber which is greater than concentration of ozone in the solution.

25. The method of claim 18 further comprising providing a gaseous atmosphere comprising a concentration of ozone within the process chamber, the gaseous atmosphere having a pressure in excess of atmospheric pressure.

26. The method of claim 18 wherein the water is deionized water.

27. The method of claim 18 wherein the exposing comprises spraying the substrate with the solution within a chamber, the spraying comprising maintaining the solution at a first temperature between approximately 20° C. and approximately 95° C., and the chamber at a second temperature between approximately 20° C. and approximately 95° C.

28. The method of claim 27 wherein the first temperature and second temperature are approximately equal.

29. The method of claim 27 wherein the first temperature is higher than the second temperature.

30. The method of claim 27 wherein the first temperature is maintained between approximately 65° C. and approximately 95° C.

* * * * *

UNITED STATES PATENT AND TRADEMARK OFFICE
CERTIFICATE OF CORRECTION

| | | |
|---|---|---|
| PATENT NO. | : 7,056,447 B2 | Page 1 of 1 |
| APPLICATION NO. | : 10/672816 | |
| DATED | : June 6, 2006 | |
| INVENTOR(S) | : Gilton | |

It is certified that error appears in the above-identified patent and that said Letters Patent is hereby corrected as shown below:

Col. 2, line 27, please delete "or" after "provide" and insert --for--.

Col. 3, line 18, please insert --a-- after "is".

Col. 4, line 17, delete "of" after "reduce".

Col. 6, line 51, please insert --are-- after "30 and 35".

Col. 6, line 56, please delete "20 C to about 95 C" after "about" and insert --20°C to about 95°C--.

Col. 6, lines 60-61, please delete "65 C to about 95 C and about 80 C to about 95 C" after "about" and insert --65°C to about 95°C and about 80°C to about 95°C --.

Col. 7, line 26, please delete "removed" before "a similar" and insert --remove--.

Col. 7, lines 34-35, please delete "65 C" after "than the" and insert --65°C--.

Col. 7, line 37, please delete "65 C" after "than the" and insert --65°C--.

Col. 8, line 61, please delete "bushing" after "for" and insert --brushing--.

Col. 9, line 53, please delete "hydrophific" after "second" and insert --hydrophilic--.

Signed and Sealed this

First Day of May, 2007

JON W. DUDAS
*Director of the United States Patent and Trademark Office*